United States Patent [19]

Oe et al.

[11] Patent Number: 4,856,005
[45] Date of Patent: Aug. 8, 1989

[54] WAVELENGTH CONVERSION ELEMENT FOR A SEMICONDUCTOR LASER

[75] Inventors: Kunishige Oe, Isehara; Hitoshi Kawaguchi, Hiratsuka; Yuzo Yoshikuni, Kawasaki, all of Japan

[73] Assignee: Nippon Telegraph and Telephone Corporation, Tokyo, Japan

[21] Appl. No.: 174,713

[22] Filed: Mar. 29, 1988

[30] Foreign Application Priority Data

Mar. 31, 1987 [JP] Japan .................................. 62-77670

[51] Int. Cl.$^4$ .......................... H01S 3/10; H01S 3/08; H01S 3/19
[52] U.S. Cl. ........................................ 372/20; 372/32; 372/50; 372/96
[58] Field of Search ....................... 372/96, 20, 45, 46, 372/102, 50, 32, 26

[56] References Cited

U.S. PATENT DOCUMENTS 4,553,239 11/1985 Akiba et al. .............................. 372/50
4,573,158 2/1986 Utaka et al. ............................. 372/96

OTHER PUBLICATIONS

Electronics Letter 23rd Oct., 1986, vol. 22, No. 22, pp. 1153-1154.
Appl. Phys. Lett. 41(8), 15 Oct. 1982, pp. 702-704.

Primary Examiner—William L. Sikes
Assistant Examiner—Georgia Y. Epps
Attorney, Agent, or Firm—Frishauf, Holtz, Goodman & Woodward

[57] ABSTRACT

A wavelength conversion element is disclosed, which comprises a substrate having integrated thereon close to each other a wavelength-tunable semiconductor laser portion which oscillates in a single mode and whose oscillation wavelength can be set up at a desired value within a given wavelength range by changing operational conditions, and a saturable absorption region optically connected to said wavelength-tunable semiconductor laser.

10 Claims, 2 Drawing Sheets

WAVELENGTH CONVERSION ELEMENT FOR A SEMICONDUCTOR LASER

BACKGROUND OF THE INVENTION

The present invention relates to semiconductor elements, more particularly, to those for use in communication, information processing and the like which are adapted to convert incident or input light having a given wavelength to outgoing or output light having a desired wavelength.

In the field of light information processing, light switching and the like in which processing of information is carried out using light which carries or bears information without converting light signals to electric signals, it has been desired to realize a wavelength conversion element which can convert input light having a given wavelength to output light having a desired wavelength since such element allows processing of information in large capacity by means of multiplex wavelengths.

Conventional types of wavelength conversion elements heretofore proposed include one which utilizes generation of second harmonic wave that is non-linear optical effect and which achieves wavelength conversion to half the original wavelength. More particularly, as Taniuchi et al. reported in an international conference, i.e., Conference on Lasers and Electro-optics, 1986, introduction of a semiconductor laser beam having a wavelength of 0.84 μm in an amount of 40 mW into a proton-exchanged light waveguide of lithium niobate substrate generates a laser beam having a wavelength of 0.42 μm in an amount of 0.4 mW (WR3 presentation). However, the conventional wavelength conversion element utilizing generation of second harmonic wave is disadvantageous since it only allows conversion of wavelength to half the wavelength of the input light.

On the other hand, in semiconductor lasers whose lasing wavelength can be tuned electrically, various types of semiconductor lasers are known as described, for example, in Y. Abe et al., Electronics Letters, vol. 17, No. 25, 10th December 1981, pages 945–947 which discloses integrated lasers with butt-jointed built-in distributed Bragg reflection waveguides in which an active guide and a built-in external guide on the surface of which is formed corrugation are butt-jointed.

Furthermore, there have been proposed multi-electrode distributed feedback reflector type semiconductor lasers as described in, for example, JP-A-No. 61-290789 which discloses a multi-electrode distributed feedback type semiconductor laser device comprising a diffractive grating over the whole length of the resonator and at least two electrodes in the direction of light axis, the electrodes being controllable with respect to their injection current supply independently of each other.

SUMMARY OF THE INVENTION

An object of the present invention is to provide a wavelength conversion element capable of converting input light having a given wavelength to light having a desired wavelength.

Another object of the present invention is to provide a wavelength conversion element capable of controlling the lasing wavelength at a desired wavelength with changing the operational conditions.

Therefore, the present invention provides a wavelength conversion element comprising a substrate having integrated thereon close to each other a wavelength-tunable semiconductor laser portion which oscillates in a single mode and whose oscillation wavelength can be set up at a desired value within a given wavelength range by changing operational conditions, and a saturable absorption region optically connected to the wavelength-tunable semiconductor laser.

DETAILED DESCRIPTION OF THE INVENTION

In the construction of the wavelength conversion element of the present invention, when input light is introduced into the saturable absorption region, the wavelength-tunable laser is put in negative temperature state with a slight amount of carriers supplied from the saturable absorption while the saturable absorption region is being saturated. Then, when the saturable absorption region has been saturated and light output increases abruptly, output light having a given wavelength is generated from the wavelength-tunable laser in the negative temperature state. Selection of the wavelength is performed by changing the operational conditions such as controlling the amount of currents of some electrodes to be injected.

DESCRIPTION OF PREFERRED EMBODIMENTS

Figure 1:
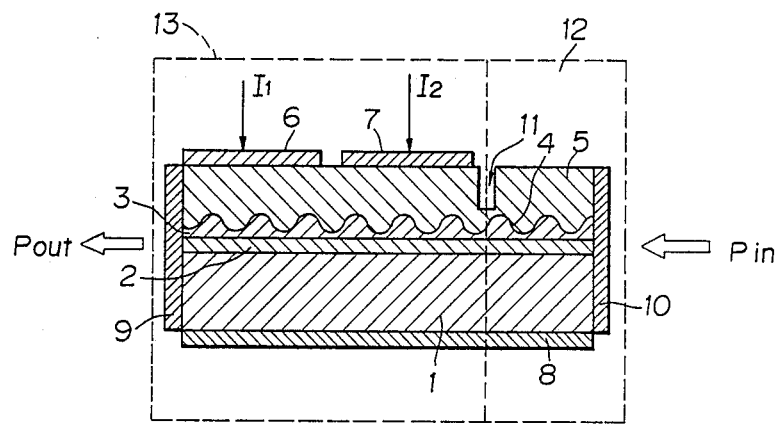
FIG. 1 is a longitudinal cross-sectional view of a wavelength conversion element according to a first embodiment of the present invention.

A preferred embodiment of the present invention will be described with reference to the attached drawings in which FIG. 1 illustrates a first embodiment of the present invention. In FIG. 1, reference numeral 1 designates an n-type InP substrate having provided thereon a 1.5 μm wavelength GaInAsP active layer 2, which has provided thereon a 1.3 μm wavelength GaInAsP waveguide layer 3. A refractive grating 4 is provided on the waveguide layer 3 above the active layer 2 such that the grating 4 forms an interface between the p-InP clad and the waveguide layer 3. Injection electrodes 6 and 7 are arranged on the clad layer 5 separate from each other in the direction of the light axis which extends horizontally along the length of the element as viewed in FIG. 1. The distance between the electrodes 6 and 7 is generally from 2 μm to 10 μm and preferably about 5 μm. On the bottom surface of the substrate 1, or the surface of the substrate 1 opposite to that on which the active layer 2 is provided, is attached an injection electrode 8 having a polarity opposite to that of the injection electrodes 6 and 7. Anti-reflection coating layers 9 and 10 are provided on the side surfaces, i.e., light input side and light output side of the light conversion element in order to prevent reflection of the light. A groove 11 for establishing electrical insulation is provided in the clad 5. The depth of the groove 11 is determined so as to attain effective insulation between a wavelength-tunable semiconductor laser portion 13 and a saturable absorption region 12. However, the groove 11 should not reach the grating or corrugation 4. Generally, the depth of the groove 11 is from 0.5 μm to 1.5 μm and preferably about 1.0 μm.

The wavelength conversion element of the present invention can be fabricated according to conventional method as described, for example, in Electronics Letters, vol. 23, No. 20, p. 1088 (1987). More particularly, it can be fabricated as follows:

At first, non-doped GaInAsP active and guide layers were grown on an n-type InP substrate. After 2400 Angstrom period corrugation grating was formed on the guide layer, a p-type InP clad layer and a GaInAsP cap layer were grown on the grating. In order to fabricate a buried heterostructure, a selective chemical etching technique was used to make a mesa-stripe of the double-heterostructure region, and surrounding InP layers consisting of a p-InP and an n-InP were grown on the etched surface by liquid phase epitaxy. Contacts were formed by evaporating An-Zn-Ni and An-Sn onto the p- and n-type sides respectively. The p-type electrode was divided into three sections by selective etching the An-Zn-Ni metal using KI etchant, and the p-electrode of the saturable absorption region was etched off. The GaInAsP cap layer and p-InP clad layer were ion-beam etched to obtain proper isolation among the electrodes and the saturable absorption region. Resistance between p-type electrodes was set at about 100 Ω (ohms), and resistance between the saturable absorption region and p-type electrode was about 1 kΩ (kilo-ohm).

In FIG. 1, a portion 12 encircled by broken line acts as a saturable absorption region since no injection of current does occur there. The saturable absorption region 12 has characteristics shown in FIG. 2 which will be described in detail hereinbelow.

The rest portion other than the saturable absorption region 12 exhibits the function of a wavelength-tunable laser as a multi-electrode distributed feedback type semiconductor laser as described in JP-A-No. 61-290789 laid-open on Dec. 20, 1986. That is, by changing the intensity of current $I_1$ passed in the injection electrode 6 and current $I_2$ passed in the injection electrode 7, there is formed in the inside of the laser a difference in the distribution of the density of carriers, which causes the change in the refractive index of the laser due to the gradient of the density of carriers. With this change, the optical pitch of the diffractive grating 4 changes in the direction of the light axis, thus allowing it to continuously change the oscillation wavelength in a single mode within a certain wavelength range which is a function of various parameters such as cavity length, resistance between electrodes 6 and 7, etc. as is known in the art.

Figure 2:
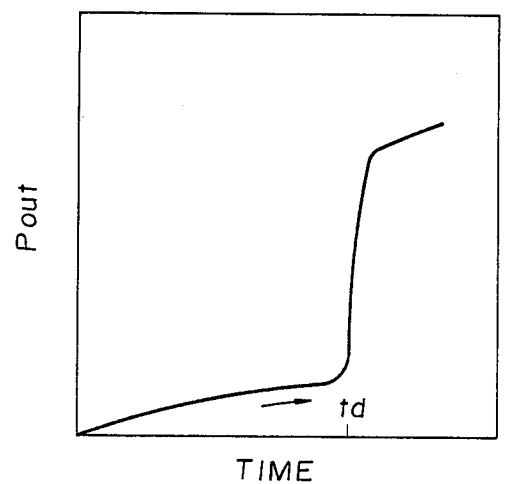
FIG. 2 is a graph showing the time-dependent change in the light output of the saturable absorption region of a wavelength conversion element of the present invention.

In the above construction, when input light $P_{in}$ having a wavelength which can be absorbed by the active layer 2 is introduced, light output rom the saturable absorption region 12 is as illustrated in FIG. 2. FIG. 2 plots period of time "t" which passes from the introduction of the input light Phd in on the horizontal axis versus the intensity of light output from the saturable absorption region 12 on the vertical axis. As will be obvious from this graph, the intensity of light output gradually increases at a low output until a certain time $t_d$ by the action of the saturable absorption region 12 followed by an abrupt increase after the time $t_d$. The time $t_d$ depends on the intensity of input light. For example, when the input light is 50 μW, the time $t_d$ is 0.8 ns. In this case, when sum I of the injection current $I_1$ and $I_2$ supplied to the wavelength-tunable laser 13 is set up to 0.94 to 0.998 time as large as the threshold value $I_{th}$ of the laser 13, the laser 13 falls in negative temperature state due to carriers generated by the absorption of input light $P_{in}$ within the time span of $t_d$ to oscillate light in a single mode whose wavelength is determined by the proportion of the injection current $I_1$ and the injection current $I_2$.

The oscillation wavelength of the laser can be changed freely in a wavelength range in which the active layer 2 has a gain by changing the proportion of the injection current $I_1$ and the injection current $I_2$. Thus, chronologically changing the proportion of the injection current $I_1$ and the injection current $I_2$, laser light having a wavelength corresponding thereto can be obtained chronologically.

In the above operation, the presence of the saturable absorption region 12 is essentially important. If there is provided no saturable absorption region 12 and only the wavelength-tunable laser 13 is provided, the element remains to amplify the wavelength of the input light but fails to function as a wavelength conversion element.

Figure 3:
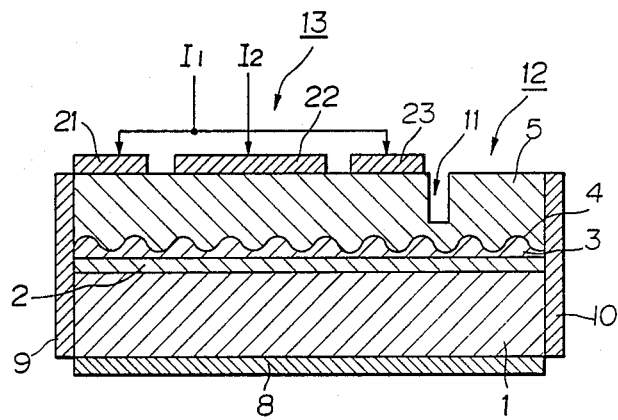
FIG. 3 is a longitudinal cross-sectional view of a wavelength conversion element according to a second embodiment of the present invention.

FIG. 3 illustrates a second embodiment of the present invention. The second embodiment differs from the first embodiment shown in FIG. 1 in the following points.

(1) The injection electrode provided on the upper end of the element is divided into 3 parts, i.e., upper electrodes 21, 22 and 23. The electrode 21 and the electrode 23 are connected electrically to each other, and the tuned wavelength can be varied by changing the proportion of the injection current $I_1$ injected to the electrodes and the injection current $I_2$ injected to the central electrode 22.

(2) The diffractive grating 4 is not uniform but shifted by ¼ phase to below the central electrode 22. Although it can be omitted, the phase shift, if present, ensures oscillation of only one of the two longitudinal modes positioned on the both sides of Bragg wavelength.

In the above construction, the element serves as a wavelength length conversion element as in the first embodiment illustrated in FIG. 1.

Figure 4:
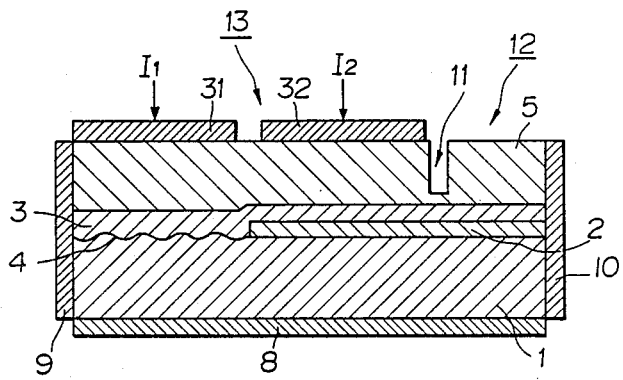
FIG. 4 is a longitudinal cross-sectional view of a wavelength conversion element according to a third embodiment of the present invention.

The wavelength-tunable laser portion 13 of the wavelength conversion element can be of any form. FIG. 4 illustrates a third embodiment of the wavelength conversion element according to the present invention in which the wavelength-tunable laser portion reported by Y. Abe et al. in Electronics Letters, vol. 17, No. 25, p. 945 (1981) is applied.

The wavelength-tunable laser portion 13 of the wavelength conversion element of this type is a so-called distributed reflector type semiconductor laser which comprises an active layer 2 that lacks a diffractive grating, a diffractive grating 4 provided only at a position on the left-hand side of the active layer 2 and below an electrode 31. The diffractive grating 4 serves as a light reflecting portion. The wavelength conversion element according to this embodiment can be fabricated similarly as in the case of the element according to the first embodiment except for the butt-jointed portion which can also be fabricated in a conventional manner as described, for example, in Electronics Letters, vol. 17, No. 25, p. 945 (1981).

In the above construction, the lasing wavelength changes with the change in the refractive index of the diffractive grating 4, the change in the refractive index being attained, for example, by varying the intensity of the injection current $I_1$ to be introduced into the electrode 31 while maintaining the intensity of the current $I_2$ at a predetermined level which is slightly lower than that of the threshold current (e.g., 0.94 to 0.998 time as high as the threshold current) to vary the proportion of $I_1/I_2$. Thus, the element functions as a wavelength conversion element.

As stated above, according to the present invention, the wavelength-tunable laser portion and the saturable absorption region together enable conversion of the input light introduced in the saturable absorption region to a laser beam having a desired wavelength within a certain wavelength range. Therefore, multiplication and exchange of information can be performed, and this results in the realization of a large capacity information processing due to wavelength multiplication.

Although no current is injected to the saturable absorption region 12 in the embodiments illustrated in FIGS. 1, 2 and 3, an electrode may be attached to the saturable absorption region 12 in order to pass current to control the amount of saturable absorption. The wavelength conversion mechanism of the present invention operates regardless of whether or not current is injected to the saturable absorption region.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. In a wavelength conversion element for a semiconductor laser, comprising a substrate having thereon an active layer, a waveguide layer, a refractive grating, a clad layer and an electrode, the improvement wherein said wavelength conversion element comprises:

(a) a wavelength-tunable semiconductor laser portion which oscillates in a single mode and whose oscillation wavelength is settable at a desired value within a given wavelength range by changing operational conditions, said wavelength-tunable semiconductor laser portion comprising a part of said active layer, a part of said waveguide layer, a part of said refractive grating, a part of said clad layer and at least two injection electrodes having the same polarity which are arranged on said part of said clad layer spaced apart from each other along a light axis and which are controllable with respect to the amount of current to be injected thereby so that a ratio of the amount of current therebetween is changeable to a predetermined value, one end surface of said laser portion servicing as an output light emitting end; and (b) a saturable absorption region optically connected to said wavelength-tunable semiconductor laser portion, said saturable absorption region comprising the remaining parts of each of said active layer, said waveguide layer, said refractive grating, and said clad layer, respectively, one end surface of said saturable absorption region serving as an input light receiving end;

whereby an input light received by said saturable absorption region is optically transferred to said wavelength-tunable semiconductor laser portion, which produces an output light whose wavelength is converted to a predetermined value as a function of the proportion of the amounts of electrical currents fed to said injection electrodes.

2. The wavelength conversion element of claim 1 wherein said semiconductor laser in said wavelength-tunable semiconductor laser portion is a multi-electrode distributed feedback semiconductor laser comprising:

said at least two injection electrodes arranged on said clad layer spaced apart from each other in the direction of said light axis one after another;

a diffractive grating arranged along the entire length of said light axis;

the quantity of current to be injected by said at least two spaced apart injection electrodes being adjustable independently of each other.

3. The wavelength conversion element of claim 1, wherein said semiconductor laser in said wavelength-tunable semiconductor laser portion is a distributed reflection type semiconductor laser in which said active portion lacks said diffractive grating, and wherein said distributed reflection type semiconductor laser comprises a light reflecting portion including said diffractive grating, said light reflection portion being adapted for varying a refractive index thereof by changing a quantity of current to be injected via said injection electrodes to render the oscillation wave tunable.

4. The wavelength conversion element of claim 1, wherein said saturable absorption region and said wavelength-tunable laser portion have a same laminated layer structure, and wherein said active layer in said saturable absorption region is continuously connected to said active layer in said wavelength-tunable laser portion.

5. The wavelength conversion element of claim 1, wherein said wavelength conversion element comprises a groove defined between said laser portion and said saturable absorption region, said groove having a depth and being located at a predetermined distance from said waveguide layer, whereby said wavelength-tunable semiconductor laser portion and said saturable absorption region are substantially insulated electrically from each other by means of said groove.

6. The wavelength conversion element of claim 2, wherein said wavelength conversion element comprises a groove defined between said laser portion and said saturable absorption region, said groove having a depth and being located at a predetermined distance from said waveguide layer, whereby said wavelength-tunable semiconductor laser portion and said saturable absorption region are substantially insulated electrically from each other by means of said groove.

7. The wavelength conversion element of claim 3, wherein said wavelength conversion element comprises a groove defined between said laser portion and said saturable absorption region, said groove having a depth and being located at a predetermined distance from said waveguide layer, whereby said wavelength-tunable semiconductor laser portion and said saturable absorption region are substantially insulated electrically from each other by means of said groove.

8. The wavelength conversion element of claim 4, wherein said wavelength conversion element comprises a groove defined between said laser portion and said saturable absorption region, said groove having a depth and being located at a predetermined distance from said waveguide layer, whereby said wavelength-tunable semiconductor laser portion and said saturable absorption region are substantially insulated electrically from each other by means of said groove.

9. In a semiconductor laser, a method for converting a wavelength of an input light from a light source to a wavelength of a desired value within a given wavelength range, comprising:

(1) providing a wavelength conversion element comprising a substrate having thereon an active layer, a waveguide layer, a refractive grating, a clad layer and an electrode, said wavelength conversion element comprising:

(a) a wavelength-tunable semiconductor laser portion which oscillates in a single mode and whose oscillation wavelength is settable at a desired value within a given wavelength range by changing operational conditions, said wavelength-tunable semiconductor laser portion comprising a part of said active layer, a part of said waveguide layer, a part of said refractive grating, a part of said clad layer and at least two injection electrodes having the same polarity which are arranged on said part of said clad layer spaced apart from each other along a light axis and which are controllable with respect to the amount of current to be injected thereby so that a ratio of the amount of current therebetween is changeable to a predetermined value, one end surface of said laser portion servicing as an output light emitting end; and (b) a saturable absorption region optically connected to said wavelength-tunable semiconductor laser portion, said saturable absorption region comprising the remaining parts of each of said active layer, said waveguide layer, said refractive grating, and said clad layer, respectively, one end surface of said saturable absorption region serving as an input light receiving end;

(2) introducing an input light into said saturable absorption region through said input receiving end surface to form carriers in said saturable absorption region;

(3) putting said wavelength tunable semiconductor laser portion in a negative temperature state with a slight amount of carriers supplied from the saturable absorption region;

(4) injecting respective currents into injection electrodes independently of each other;

(5) changing the respective amount of said currents to generate a difference in the distribution of the density of carriers in the inside of said laser, thus causing a change in the refractive index of said laser in the direction of the light axis of said laser; and (6) allowing said laser to oscillate with a changing oscillation wavelength in a single mode within a predetermined wavelength range, thus emitting an output light with a wavelength within a given wavelength range different than the wavelength of said input light received through said light receiving end surface of said laser portion.

10. The method of claim 9, further comprising providing said clad layer with a groove defined between said laser portion and said saturable absorption region, said groove having a depth and being located at a predetermined distance from said waveguide layer, whereby said wavelength-tunable semiconductor laser portion and said saturable absorption region are substantially insulated electrically from each other by said groove.

* * * * *